US008681089B2

(12) United States Patent
Huang et al.

(10) Patent No.: US 8,681,089 B2
(45) Date of Patent: Mar. 25, 2014

(54) TOUCH PANEL, TFT-LCD ARRAY SUBSTRATE AND MANUFACTURING METHOD THEREOF

(75) Inventors: Yinglong Huang, Beijing (CN); Zheng Wang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 1056 days.

(21) Appl. No.: 12/717,291

(22) Filed: Mar. 4, 2010

(65) Prior Publication Data

US 2010/0225609 A1   Sep. 9, 2010

(30) Foreign Application Priority Data

Mar. 4, 2009   (CN) .......................... 2009 1 0078873

(51) Int. Cl.
*G09G 3/36*   (2006.01)
*G06F 3/041*   (2006.01)
*G06F 3/038*   (2013.01)
*H01L 21/00*   (2006.01)

(52) U.S. Cl.
USPC .............. 345/104; 345/173; 345/206; 438/30

(58) Field of Classification Search
USPC ................ 345/104, 173, 206; 349/48; 438/30
See application file for complete search history.

(56) References Cited

U.S. PATENT DOCUMENTS

| 2004/0150629 A1* | 8/2004 | Lee ............................. 345/173 |
| 2007/0091013 A1* | 4/2007 | Pak et al. ...................... 345/50 |
| 2007/0176905 A1 | 8/2007 | Shih et al. |
| 2008/0030633 A1 | 2/2008 | Tsai et al. |
| 2008/0100587 A1* | 5/2008 | Sano et al. ..................... 345/173 |
| 2010/0194697 A1* | 8/2010 | Hotelling et al. .............. 345/173 |

FOREIGN PATENT DOCUMENTS

| CN | 1916712 A | 2/2007 |
| CN | 101082744 A | 12/2007 |

* cited by examiner

*Primary Examiner* — Srilakshmi K Kumar
*Assistant Examiner* — Sosina Abebe
(74) *Attorney, Agent, or Firm* — Ladas & Parry LLP

(57) ABSTRACT

A touch display comprising a first substrate formed with a common electrode; a second substrate formed with a gate line and a data line, wherein a first thin film transistor and a pixel electrode is provided in a pixel region defined by the gate line and the data line and the pixel region and the common electrode form a liquid crystal capacitor; a touch element provided in the pixel region in the second substrate and used to sense a touch voltage reflecting the change of the liquid crystal capacitance at a touch point; and a touch processing device connected with the touch element and used to obtaining a position coordinates of the touch point according to the touch voltage.

13 Claims, 5 Drawing Sheets

A1 - A1

B1 - B1

A2 - A2

B2 - B2

A3 - A3

B3 - B3

TOUCH PANEL, TFT-LCD ARRAY SUBSTRATE AND MANUFACTURING METHOD THEREOF

BACKGROUND

The present invention relates to a touch display, a thin film transistor liquid crystal display (TFT-LCD) array substrate and a manufacturing method thereof.

Touch panels have a variety of types, which can be mainly classified as an inductance type, a capacitance type and a resistance type according to the operating mechanism of touching function. Control is realized by a pressure sensing for the resistance type, in which two conductive layers are provided. The two conductive layers contact with each other at the touch point when the panel is touched by a finger, which leads to a change of the resistance, and thus the touch point can be detected. Induced current is used in the capacitance type, in which a conductive layer is provided with four electrodes at the four corners thereof. When the panel is touched by a finger, the conductive layer forms a coupling capacitor (condenser) together with the finger, and in this case, there is a change in current in the four electrodes, through which the touch point can be detected.

A main structure of a thin film transistor liquid crystal display (TFT-LCD) comprises an array substrate and a color filter substrate bonding together with a liquid crystal layer sandwiched therebetween. A gate line, a data line, a pixel electrode and a thin film transistor (TFT) are formed on the array substrate, and a black matrix, a color resin and a common electrode are formed on the color filter substrate. The operating mechanism of the TFT-LCD is to display image by controlling the transmittance of the liquid crystal with an electric field, which specifically includes the following steps. An ON signal is applied to the gate line to turn on the TFT, a data voltage over the data line is transmitted to the pixel electrode through the TFT, and the data voltage is maintained in a storage capacitance to ensure that the data voltage is not lost when the TFT is turned off. Thus, a voltage difference is generated between the pixel electrode and the common electrode, and the liquid crystal molecular is rotated under the electric field due to the voltage difference so as to display the image.

SUMMARY

An embodiment of the invention provides a touch display comprising: a first substrate formed with a common electrode; a second substrate formed with a gate line and a data line, wherein a first thin film transistor and a pixel electrode is provided in a pixel region defined by the gate line and the data line and the pixel region and the common electrode form a liquid crystal capacitor; a touch element provided in the pixel region in the second substrate and used to sense a touch voltage reflecting the change of the liquid crystal capacitance at a touch point; and a touch processing device connected with the touch element and used to obtaining a position coordinates of the touch point according to the touch voltage.

Another embodiment of the invention provides a thin film transistor liquid crystal display (TFT-LCD) array substrate comprising a gate line, a data line and a power supply line and a signal line formed on the substrate, wherein, the gate line and the data line define a pixel region, and a pixel electrode, a first thin film transistor, a second thin film transistor and a third thin film transistor are formed in the pixel region, wherein, the first thin film transistor is used to provide a data voltage to the pixel electrode, the second thin film transistor is used to generate a touch voltage reflecting the change of the liquid crystal capacitance at a touch point, and the third thin film transistor is used to send the touch voltage to the signal line.

Another embodiment of the invention provides a manufacturing method of a liquid crystal display (TFT-LCD) array substrate comprises the following steps. Step 1, depositing a gate metal film on a substrate, forming a gate line, a common electrode line, a first gate electrode, a second gate electrode, a third gate electrode and a first connecting electrode, wherein, the first gate electrode and the third gate electrode are connecting with the gate line, and the second gate electrode is connected with the first connecting electrode; Step 2, depositing a gate insulating layer, a semiconductor film, a doped semiconductor film and a source/drain metal film on the substrate after step 1, forming a data line, a power supply line, a signal line, a first source electrode, a first drain electrode, a first TFT channel region, a second source electrode, a second drain electrode, a second TFT channel region, a third source electrode, a third drain electrode, a third TFT channel region and a second connecting electrode by a patterning process, wherein, the first drain electrode is connected with the second connecting electrode and the second drain electrode is connected with the third drain electrode; Step 3, depositing a passivation layer on the substrate after step 2, and forming a first through hole, a second through hole and a third though hole, wherein, the first through hole is located above the first connecting electrode, the second through hole is located above the second connecting electrode, and the third though hole is located above the first drain electrode; and Step 4, depositing a transparent conductive film on the substrate after step 3, forming a pixel electrode and a third connecting electrode, wherein the pixel electrode is connected with the first drain electrode via the third through hole and the third connecting electrode is connected with the first connecting electrode and the second connecting electrode via the first through hole and the second through hole, respectively.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

The embodiments of the invention will be further described in detail with reference to the drawings.

A touch display according to an embodiment of the invention comprises an array substrate and a color filter substrate bonding together with a liquid crystal layer therebetween. The color filter substrate, as a first substrate, comprises a plurality of black matrixes and a plurality of color resin units arranged in a matrix with a common electrode formed on the black matrixes and the color resin units. The array substrate, as a second substrate, comprises gate lines and data lines vertical to each other which define a plurality of pixel regions arranged in a matrix, and each pixel region includes a pixel electrode and a thin film transistor (TFT). Each pixel electrode on the array substrate and the common electrode on the color filter substrate constitute a liquid crystal capacitor. Touch elements are further provided within the pixel regions on the array substrate, and are arranged based on pixels as a unit and used to generate a touch voltage reflecting the change of liquid crystal capacitance at the touch point. The touch elements are connected with a touch processing device which is used to obtain the position coordinates of the touch point according to the touch voltage.

Figure 1:
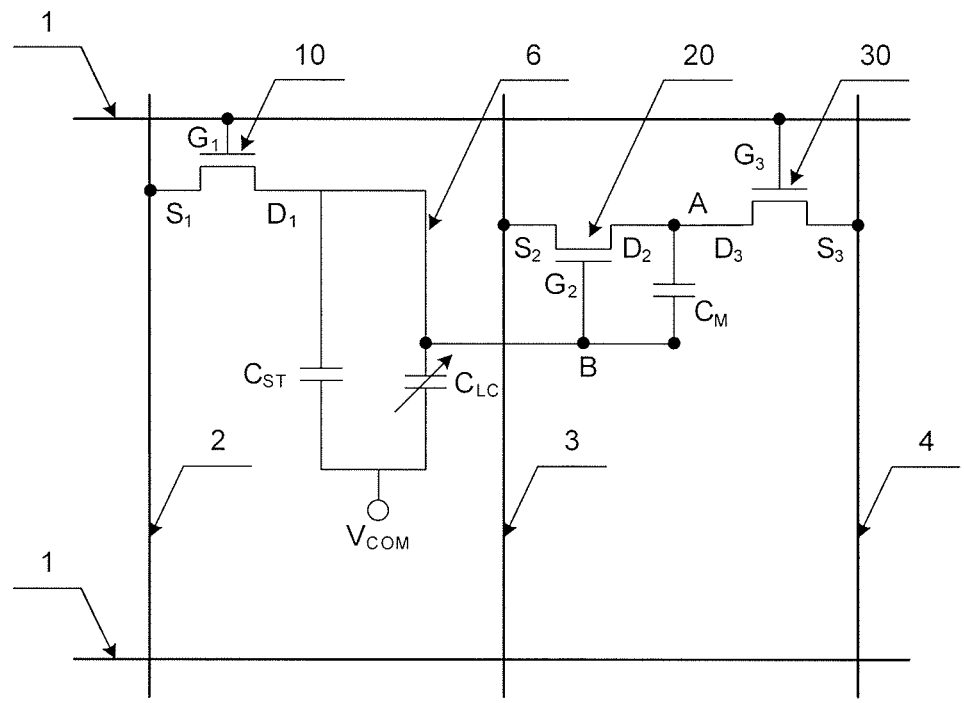
FIG. 1 is a equivalent circuit diagram of one pixel region on the touch display array substrate according to the embodiment of the invention.

FIG. 1 shows an equivalent circuit diagram of a pixel region on the touch display array substrate according to the embodiment of the invention. As shown in FIG. 1, the touch display according to the embodiment of the invention comprises a gate line 1 and a data line 2 which define a pixel region. A power supply line 3, a signal line 4, a pixel electrode 6, a first thin film transistor (TFT) 10, a second TFT 20, and a third TFT 30 are formed in the pixel region. The power supply line 3, the signal line 4, the second TFT 20 and the third TFT 30 constitute a touch element according to the embodiment of the invention. The power supply line 3 is parallel with the data line 2 and used to supply the operating voltage. The signal line 4 is parallel with the data line 2 and used to send a touch voltage to the touch processing device.

The first TFT 10 is connected with the gate line 1, the data line 2 and the pixel electrode 6, respectively, and used to provide a data voltage to the pixel electrode 6. The second TFT 20 is connected with the power supply line 3 and the pixel electrode 6, respectively, and used to sense the voltage change in the pixel electrode caused by the liquid crystal capacitance change at the touch point and generate the touch voltage reflecting the voltage change in the pixel electrode. The third TFT 30 is connected with the gate line 1, the data line 4, and the second TFT 20, respectively, and used to send the touch voltage to the signal line 4.

Specifically, the first TFT 10 comprises a first gate electrode $G_1$, a first source electrode $S_1$ and a first drain electrode $D_1$. The first gate electrode $G_1$ is connected with the gate line 1 that is used to provide an "ON" signal to the first TFT 10. The first source electrode $S_1$ is connected with the data line 2, and the first drain electrode $D_1$ is connected with the pixel electrode 6, so that the data voltage over the data line 2 may be provided to the pixel electrode 6 though the first TFT 10. The pixel electrode 6 forms a liquid crystal capacitor $C_{LC}$ together with the common electrode (supplied with a common voltage $V_{COM}$) of the color filter substrate, and, one the other hand, forms a storage capacitor $C_{ST}$ together with the storage electrode of the array substrate, so that the data voltage can be maintained by the liquid crystal capacitance $C_{LC}$ and the storage capacitance $C_{ST}$ (the storage capacitor $C_{ST}$ is not essential and may be omitted when necessary).

The second TFT 20 comprises a second gate electrode $G_2$, a second source electrode $S_2$ and a second drain electrode $D_2$. The second gate electrode $G_2$ is connected with the pixel electrode 6, so that the degree of the "ON" state of the second TFT 20 may be changed by the voltage change of the pixel electrode caused by the liquid crystal capacitance change at the touch point. The second source electrode $S_2$ is connected with the power supply line 3, and an operation capacitor $C_M$ is provided between the second drain electrode $D_2$ and the second gate electrode $G_2$, so that the operating voltage provided from the power supply line 3 can be stored in the operation capacitor $C_M$, and the touch voltage changing with the degree of the "ON" state of the second TFT 20 is generated. That is to say, when the second TFT 20 senses the voltage change of the pixel electrode 6 caused by the change of the liquid crystal capacitor $C_{LC}$ at the touch point, the voltage change of the pixel electrode is reflected on the change of the voltage of the operation capacitor $C_M$.

The third TFT 30 comprises a third gate electrode $G_3$, a third source electrode $S_3$ and a third drain electrode $D_3$. The third source electrode $G_3$ is connected with the gate line 1 which is used to provide an "ON" signal to the third TFT 30. The third source electrode $S_3$ is connected with the signal line 4, and the third drain electrode $D_3$ is connected with the second drain electrode $D_2$ of the second TFT 20, so that the touch voltage can be sent to the signal line 4 through the third TFT 30. The position coordinates of the touch point is finally obtained by the touch processing device according to the touch voltage.

The touch display according to the embodiment of the invention relates to a technical solution in which the touch signal is obtained by sensing the change of the liquid crystal capacitance. The commonly known liquid crystal capacitance is calculated as: $C_{LC}=\in A/d$, wherein, $C_{LC}$ is the liquid crystal capacitance, E is the dielectric constant of the liquid crystal filled between the array substrate and the color filter substrate, A is the area of the electrode boards, and d is the distance between the electrode boards. Since the liquid crystal is of a characteristics of anisotropy, i.e., the dielectric constant in the vertical direction is different from that in the horizontal direction. When the liquid crystal panel is touched and the gap between the array substrate and the color filter substrate is changed, the distance between the electrode boards is changed, which leads to the change of orientation of the liquid crystal. The change of orientation of the liquid crystal in turn leads to the change of the dielectric constant $\in$ of the liquid crystal, which finally causes the change of the liquid crystal capacitance $C_{LC}$. According to the law of electric charge conservation, the change of the liquid crystal capacitance will lead to the voltage change of the pixel electrode. The embodiment of the invention is to collect and process the above changes and obtain the position coordinates of the touch position.

Figure 2:
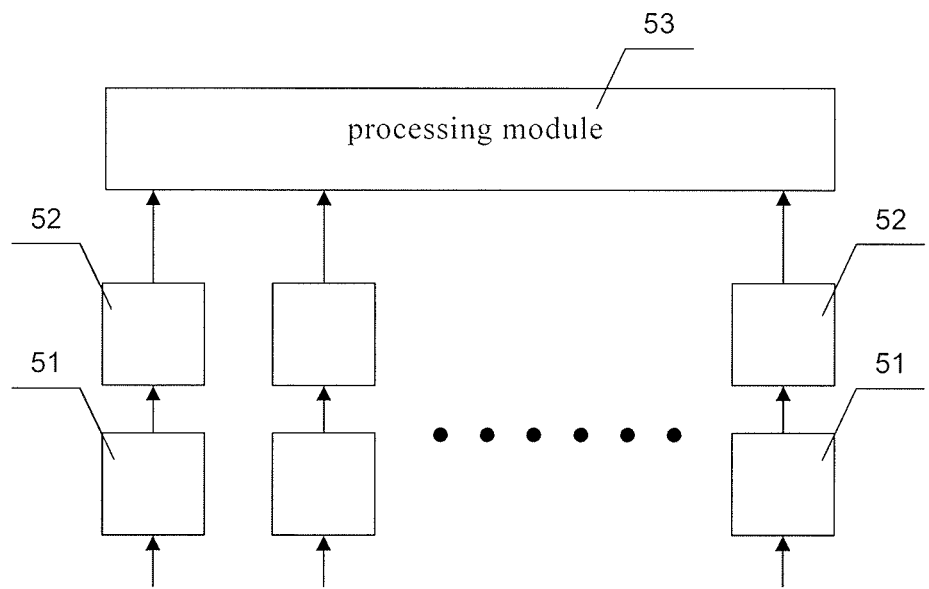
FIG. 2 is a schematic view showing a configuration of a touch processing device according to an embodiment of the invention.

FIG. 2 is a schematic view showing the configuration of the touch processing device in the touch display according to the embodiment of the invention. As shown in FIG. 2, the touch processing device according to the embodiment of the invention comprises acquisition modules 51, judgment modules 52 and a processing module 53. The number of the acquisition modules 51 and the judgment modules 52 is the same to that of the signal lines. Each acquisition module 51 is connected with one signal line and used to collect the touch voltage from the signal line. Each judgment module 52 is connected to one acquisition module and used to compare the touch voltage and a reference voltage that is predetermined. It is judged as occurrence of a touch behavior in the case where the difference between the touch voltage and the reference voltage is larger than a predetermined threshold voltage, and a touch signal is generated and sent to the processing module 53. The processing module 53 is connected with all judgment modules 52 and used to receive the touch signal sent by the judgment modules 52. After receiving the touch signal, the processing module 53, through a time sequence controller connected thereto, determine the column number of the signal line which sends the touch signal and determine the row number of the gate line corresponding to the touch signal, then determine the position coordinates of the touch point according to the row number of the gate line and the column number of the signal line. The column number of the signal line may be considered as a horizontal coordinate of the touch point, the row number of the gate line may be considered as a vertical coordinate, and the intersect of the horizontal coordinate and the vertical coordinate is the position of the touch point. In practice, each acquisition module may comprise a signal collector used to collect the touch voltage from the signal line and a signal amplifier used to amplify the touch voltage. Each judgment module may comprise a voltage comparator and the signal generator. The voltage comparator is used to compare the touch voltage and the predetermined reference voltage. The signal generator is used to generate the touch signal reflecting the touch behavior and send it to the processing module in the case that the difference between the touch voltage and the reference voltage is larger than the threshold voltage.

The technical solution according to the embodiment of the invention is further described based on the operation process of the touch display. During the operation of the touch display according to the embodiment of the invention, since the first gate electrode $G_1$ of the first TFT 10 and the third gate electrode $G_3$ of the third TFT 30 are connected with the gate line 1, the first TFT 10 and the third TFT 30 is turned on when the "ON" signal is provided to the gate line 1 from a gate line driver. Due to the "ON" state of the first TFT 10, the first source electrode $S_1$ and the first drain electrode D1 of the first TFT 10 is electrically communicated with each other, the data voltage on the data line 2 is applied on the pixel electrode 6 connected with the first drain electrode $D_1$ and maintained by the liquid crystal capacitor $C_{LC}$ and the storage capacitor $C_{ST}$. Since the pixel electrode 6 is connected with the second gate electrode $G_2$ of the second TFT 20, the pixel electrode 6 turns on the second TFT 20. Due to the "ON" state of the second TFT 20, the source electrode $S_2$ and the drain electrode $D_2$ of the second TFT 20 are electrically communicated with each other, and the operation voltage on the power supply line 3 is applied on the operation capacitor $C_M$ between the second gate electrode $G_2$ and the second drain electrode $D_2$ of the second TFT 20, so that the node A is applied with the touch voltage. Since the second drain electrode $D_2$ of the second TFT 20 is connected with the third drain electrode $D_3$ of the third TFT $D_3$ and the third TFT 30 is in an "ON" state, the touch voltage at the node A is read by the signal line 4 and sent to the touch processing device according to the embodiment of the invention. After collecting the touch voltage from the signal lines, the touch processing device compares the touch voltage and the predetermined reference voltage and judges if the touch behavior occurs. The output of the power supply line 3 may be a constant voltage and the electrical parameters of the first, second and third TFTs 10, 20 and 30 have been pre-set, and therefore, the reference voltage is easy to be determined.

When the touch display according to the embodiment of the invention is not touched, there is no change in the liquid crystal capacitance, in the voltage of the pixel electrode 6 and in the voltage of the second gate electrode $G_2$ of the second TFT 20, and the degree of the "ON" state of the second TFT 20 is stable. In this case, the node A has the first touch voltage V1 which is close to the predetermined reference voltage, and therefore, the touch processing device judge that no touch behavior occurs.

When the touch display according to the embodiment of the invention is touched, the liquid crystal capacitance $C_{LC}$ in the pixel region in which the touch point is located changes accordingly, which leads to the voltage change of the pixel electrode 6. Since the second gate electrode $G_2$ of the second TFT 20 is connected with the pixel electrode 6, the voltage at the node A changes accordingly. The change of the voltage at the node B means that the "ON" voltage of the second TFT 20 changes, and therefore, the degree of the "ON" state of the second TFT 20 is changed. That is to say, the degree of the electrical communication between the second source electrode $S_2$ and the second drain electrode $D_2$ of the second TFT 20 is changed, the charging degree on the operation capacitor $C_M$ by the operation voltage of the power supply line 3 is changed, and the node A has the second touch voltage V2. After the second touch voltage V2 at node A is read by the signal line 4 via the third TFT 30, and the signal is sent to the touch processing device according to the embodiment of the invention. The touch processing device compares the second touch voltage V2 and the predetermined reference voltage, and judges that the touch behavior occurs, generates a touch signal and determines the position coordinates of the touch point when the difference between the second touch voltage V2 and the reference voltage is larger than the predetermined threshold voltage.

It can be seen from the above-described technical solution that, in the embodiment of the invention, the first TFT is used to address on the data voltage and realize the image display. The second TFT is used to sense the voltage change of the pixel electrode caused by the change of the liquid crystal capacitance at the touch point and generate a touch voltage which reflects the voltage change of the pixel electrode. The third TFT is used to send the touch voltage to the corresponding signal line. The position coordinates of the touch point is finally obtained by the touch processing device. When the touch display according to the embodiment of the invention is touched, in the region of the touch point, the liquid crystal capacitance $C_{LC}$ is increased and the voltage of the pixel electrode 6 is increased. The voltage at the node B is increased and the degree of the "ON" state of the second TFT 20 is enhanced, and the touch voltage at the node A is increased.

Hence, the process amplifies the degree of the change of the liquid crystal capacitance, and ensures the judgment on the occurrence of the touch behavior.

For example, for a liquid crystal display with a resolution of 1024×768, the area of the touch point is much larger than that of a pixel point. Therefore, the pixel structure with touch element according to the embodiment of the invention may be arranged based on pixel point as a unit. Only one pixel structure with the touch element according to the embodiment of the invention is provided for n pixel points. Each pixel point comprises three sub-pixels, i.e., a red (R) sub-pixel, a blue (B) sub-pixel and a green (G) sub-pixel. Each sub-pixel corresponds to one pixel region described in the embodiment. Here, n is an integer in the range from 1 to 100. That is to say, the pixel structure with the touch element is only provided in one pixel region out of 3n pixel regions included in n pixel points. The pixel structure with the touch element according to the embodiment of the invention may be provided in the pixel region corresponding to the blue sub-pixel so as to decrease the influence on the aspect ratio and the display performance as much as possible. Of course, the resolution becomes higher as n decreases.

The embodiment of the invention provides a touch display in which the voltage change of the pixel electrode caused by the liquid crystal capacitance change during touch is sensed though the power supply line and the second TFT so as to induce the change of the touch voltage in one hand, the change of the touch voltage is read via the signal line and the third TFT on the other hand, and the position coordinates of the touch point is determined by the touch processing device. Comparing with the liquid crystal display with an additional touch panel outside, the thickness and the weight of the liquid crystal display according to the embodiment of the invention do not increase, the light transmittance, the brightness and the display performance of the liquid crystal display do not decrease while the manufacturing process is simplified and the produce cost is decreased.

Figure 3:
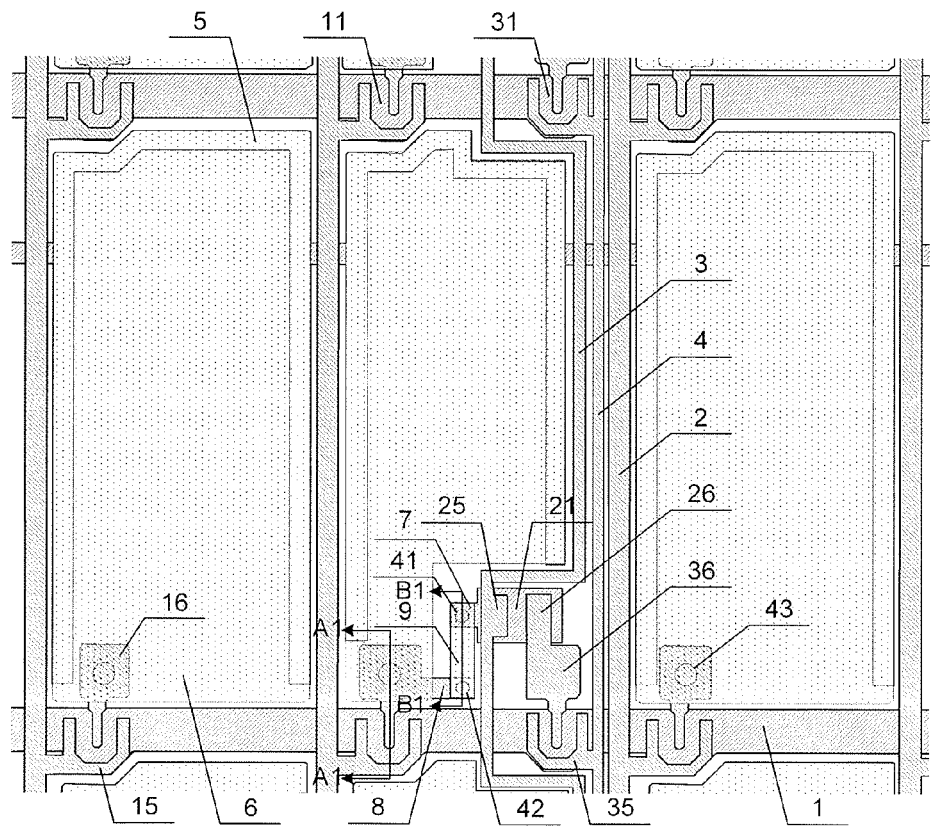
FIG. 3 is a plan view of the TFT-LCD array substrate according to the embodiment of the invention.
Figure 4:
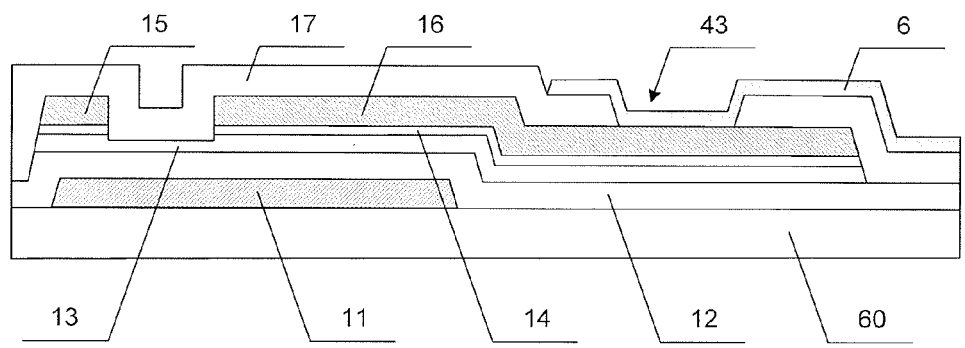
FIG. 4 is a cross-sectional view taken along line A1-A1 in FIG. 3.

FIG. 3 is a plan view of the TFT-LCD array substrate according to the embodiment of the invention, showing the structure of three pixel regions, within one of which the pixel structure with a touch element is provided. FIG. 4 is a cross sectional view taken along line A1-A1 in FIG. 3, and FIG. 5 is a cross sectional view taken along line B1-B1 in FIG. 3.

Figure 5:
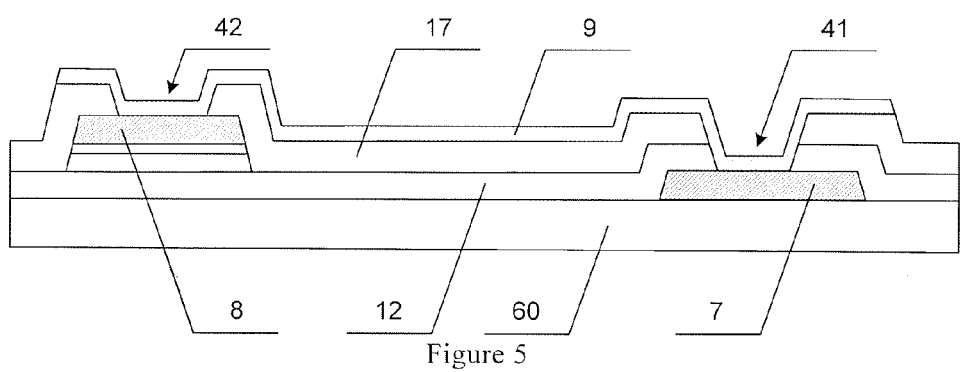
FIG. 5 is a cross-sectional view taken along line B1-B1 in FIG. 3.

As shown in FIG. 3~5, the main structure of the TFT-LCD array substrate according to the embodiment of the invention comprises a gate line 1 and a data line 2 formed on a substrate 60. The gate line 1 and the data line 2 are perpendicular with each other and define a pixel region. A power supply line 3, a signal line 4, and a common electrode line 5, a pixel electrode 6, a first TFT, a second TFT and a third TFT are formed in the pixel region. The gate line 1 is used to provide a gate signal such an "ON" signal to the first TFT, the data line 2 is used to provide a data signal to the pixel electrode 6. The common electrode line 5 and the pixel electrode 6 constitute a storage capacitor and form a "Π" shape light blocking structure together with a light blocking bar. The first TFT is used to address the data voltage. The second TFT is used to sense the voltage change of the pixel electrode caused by the liquid crystal capacitance change at a touch point and generates a touch voltage reflecting the voltage change of the pixel electrode. The third TFT is used to send the touch voltage to the signal line. The power supply line 3, the signal line 4, the second TFT and the third TFT constitute the touch element according to the embodiment of the invention.

The first TFT comprises a first gate electrode 11, a gate insulating layer 12, a first source layer, a first source electrode 15, a first drain electrode 16, a first TFT channel region and a passivation layer 17. The first gate electrode 11 is formed on the substrate 60 and connected with the gate line 1. The gate insulating layer 12 is formed on the first gate electrode 11 and the gate line 1 and covers the whole substrate 60. The first active layer, comprising a stack of a semiconductor layer 13 and a doped semiconductor layer 14, is formed on the gate insulating layer and located above the gate electrode 11. The first source electrode 15 and the first drain electrode 16 is formed on the first active layer. One end of the first source electrode 15 is located above the first gate electrode 11 and the other end thereof is connected with the data line 2; one end of the drain electrode 16 is located above the first gate electrode and the other end thereof is connected with the pixel electrode. The first TFT channel region is formed between the first source electrode 15 and the first drain electrode 16 with the doped semiconductor layer being completely removed and the semiconductor layer being partially etched in the thickness direction in the first TFT channel region, so that the semiconductor layer 13 in the first TFT channel region is exposed. The passivation layer 17 is formed on the data line 2, the first source electrode 15, the first drain electrode 16 and the first TFT channel region and covers the whole substrate. A third through hole 43, by which the first drain electrode 16 and the pixel electrode 6 are connected, is provided therethrough at the location of the first drain electrode 16.

The second TFT comprises a second gate electrode 21, the gate insulating layer 12, a second active layer, a second source electrode 25, a second drain electrode 26, a second TFT channel region and the passivation layer 17. The second gate electrode 21 is formed on the substrate 60 and connected with the first drain electrode 16 of the first TFT, and the gate insulating layer 12 is also formed on the second gate electrode 21. The second active layer, comprising the stack of the semiconductor layer 13 and the doped semiconductor layer 14, is formed on the gate insulating layer 12 and located above the second gate electrode 21. The second source electrode 25 and the second drain electrode 26 are formed on the second active layer. One end of the second source electrode 25 is located above the second gate electrode 21 and the other end thereof is connected with the power supply line 3; one end of the drain electrode 26 is located above the second gate electrode 21 and opposite to the second source electrode 25. The second TFT channel region is formed between the second source electrode 25 and the second drain electrode 26 with the doped semiconductor layer being completely etched away and the semiconductor layer being partially etched in the thickness direction in the second TFT channel region so that the semiconductor layer in the TFT channel region is exposed. Furthermore, an operation capacitor is formed at the overlapping region between the second drain electrode 26 and the second gate electrode 21, and the passivation layer 17 is formed on the power supply line 3, the second source electrode 25, the second drain electrode 26 and the second TFT channel region.

The third TFT comprises a third gate electrode 31, the gate insulating layer 12, a third active layer, a third source electrode 35, a third drain electrode 36, a third TFT channel region and the passivation layer 17. The third gate electrode 31 is formed on the substrate 60 and connected with the gate line 1. The gate insulating layer 12 is formed on the third gate electrode 31. The third active layer, comprising the stack of the semiconductor layer 13 and the doped semiconductor layer 14, is formed on the gate insulating layer 12 and located above the third gate electrode 31. The third source electrode 35 and the third drain electrode 36 are formed on the third active layer. One end of the source electrode 35 is located above the gate electrode 31 and the other end thereof is connected with the signal line 4; one end of the third drain electrode 36 is located above the third gate electrode 31 and the other end thereof is connected with the second drain electrode 26 of the second TFT. The third TFT channel region is formed between the third source electrode 35 and the third drain electrode 36 with the doped semiconductor layer being completely etched away and the semiconductor layer being partially etched in the thickness direction in the region so that the semiconductor layer in the region is exposed. The passivation layer 17 is formed on the signal line 4, the third source electrode 35, the third electrode 36 and the third TFT channel region.

According to the embodiment of the invention, the second gate electrode 21 is connected with the first drain electrode 16 via a first connecting electrode 7, a second connecting electrode 8 and a third connecting electrode 9. The first connecting electrode 7 is connected with one end of the second gate electrode 21, and the second connecting electrode 8 is connected with one end of the first drain electrode 16, and the third connecting electrode 9 is connected with the first and second connecting electrodes 7 and 8 via a first though hole 41 provided on the first connecting electrode 7 and a second through hole 42 provided on the second connecting electrode 8. Thus, the second gate electrode 21 is connected with the first drain electrode 16 via the first connecting electrode 7, the first through hole 41, the third connecting electrode 9, the second through hole 42 and the second connecting electrode 8. Furthermore, the common electrode line 5 is provided on the substrate 60 at the same layer with the gate line 1 and constitutes a "Π" shape light blocking structure with the light blocking bar. The pixel electrode 6 covers the common electrode line 5 completely so that the pixel electrode 6 and the common electrode 5 form a storage capacitor on common electrode line (Cst on Common) structure.

FIGS. 6~14 are schematic views showing the manufacturing process of a TFT-LCD according to the embodiment of the invention. In the following description, the patterning process in the embodiment of the invention comprises the processes such as applying photoresist, masking, exposing and developing the photoresist, etching with the photoresist pattern, removing the photoresist and the like. The positive type photoresist is described as an example.

Figure 6:
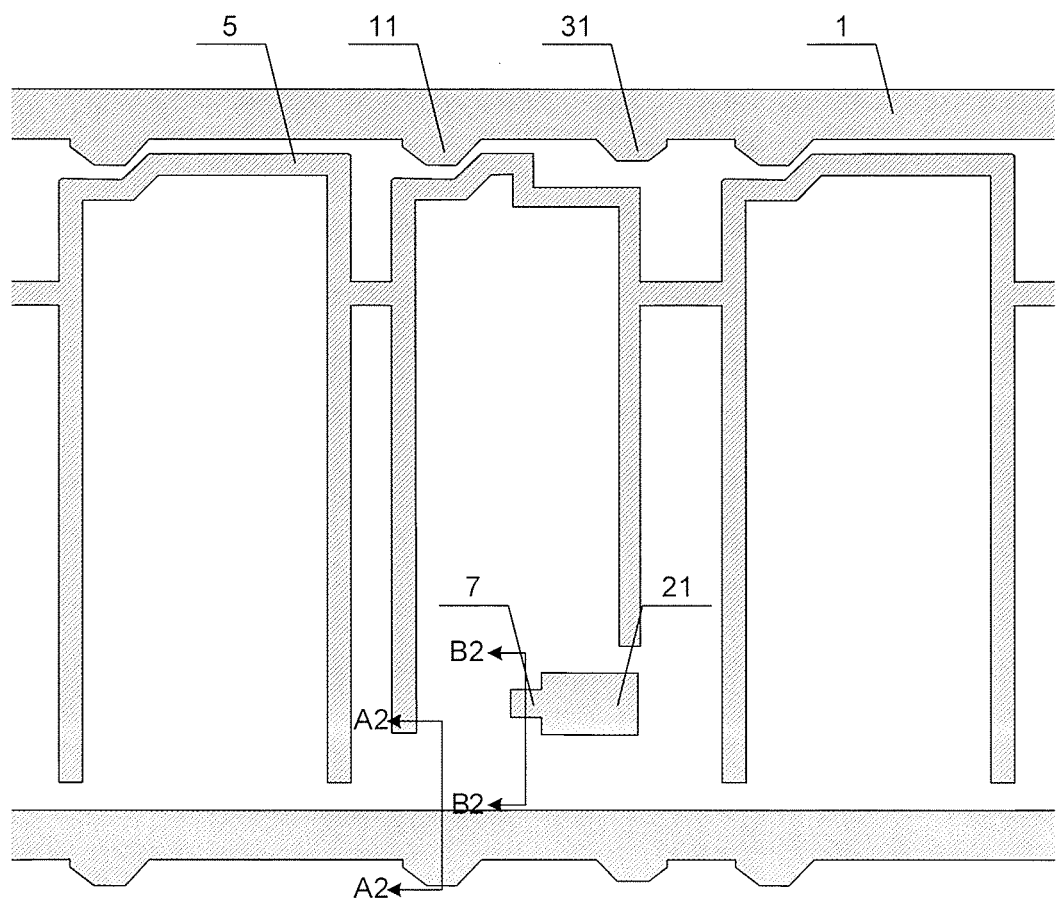
FIG. 6 is a plan view of the TFT-LCD array substrate after a first patterning process according to the embodiment of the invention.
Figure 7:
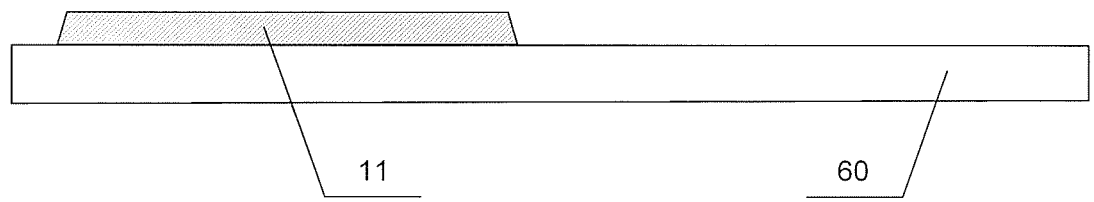
FIG. 7 is a cross-sectional view taken along line A2-A2 in FIG. 6.
Figure 8:
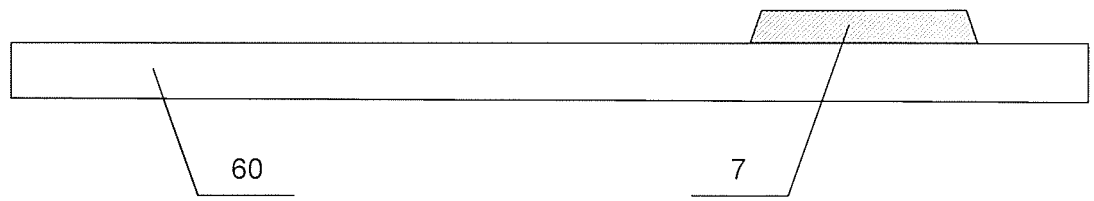
FIG. 8 is a cross-sectional view taken along line B2-B2 in FIG. 6.

FIG. 6 is a plan view showing the TFT-LCD array substrate according to the embodiment of the invention after a first patterning process, showing the structure of three pixel regions, within one of which the pixel structure with a touch element is provided. FIG. 7 is a cross sectional view taken along the line A2-A2 in FIG. 6, and FIG. 8 is a cross sectional view taken along the line B2-B2 in FIG. 6.

Firstly, a layer of gate metal film, which may be a single layer or a composite film of multiple layers, is deposited on a substrate 60 by a magnetic sputtering or thermal evaporation method. The gate metal film is patterned with a normal mask so that a gate line 1, a first gate electrode 11, a second gate electrode 21, a third gate electrode 31 and a common electrode line 5 are formed on the substrate 60. The first gate electrode 11 and the third gate electrode 31 are connected with the gate line 1, and the second gate electrode 21 is provided alone with one end towards the first gate electrode 11 in connected with a first connecting electrode 7, and the common electrode line 5 forms a "Π" shape light blocking bar together with a light blocking bar 18, as shown in FIGS. 6~8.

Figure 9:
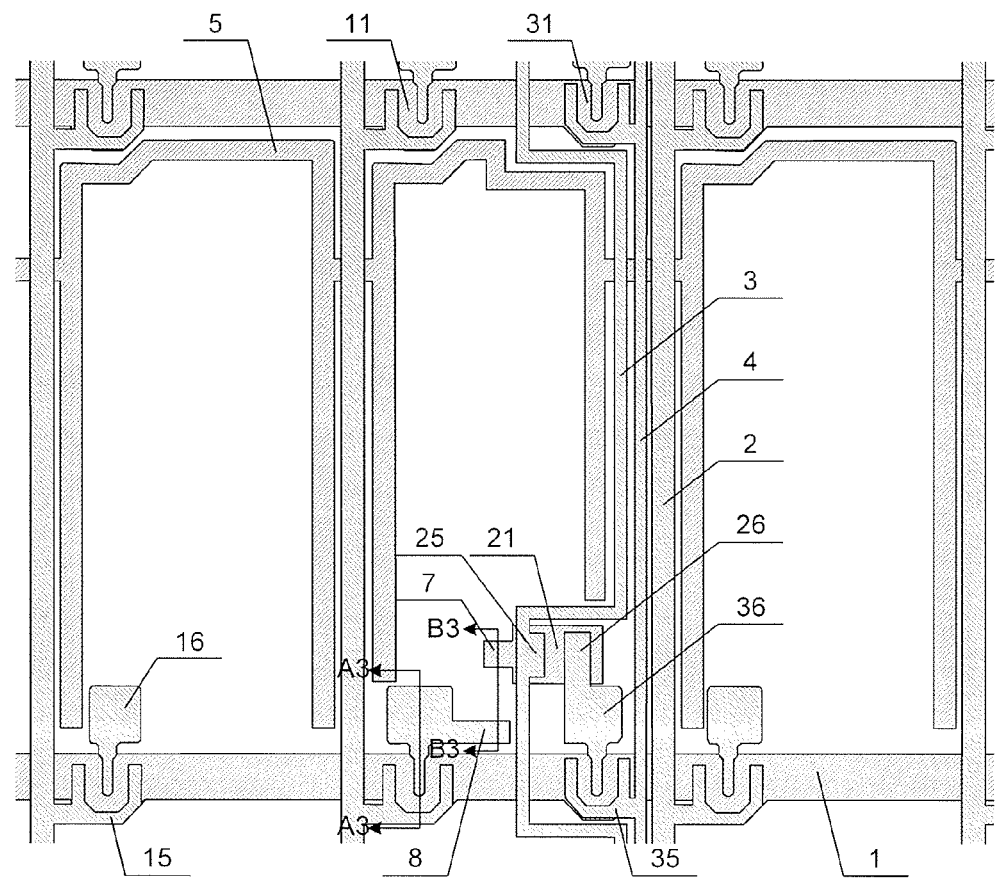
FIG. 9 is a plan view of the TFT-LCD array substrate after a second patterning process according to the embodiment of the invention.

FIG. 9 is a plan view shown the TFT-LCD array substrate according to the embodiment of the invention after a second patterning process, which reflects a structure of three pixel regions, wherein the pixel structure with the touch element is provided in one pixel region.

Figure 10:
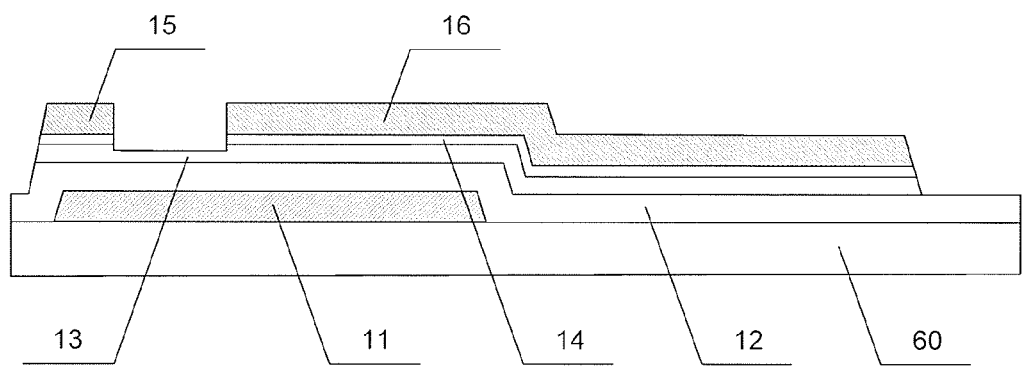
FIG. 10 is a cross-sectional view taken along line A3-A3 in FIG. 9.
Figure 11:
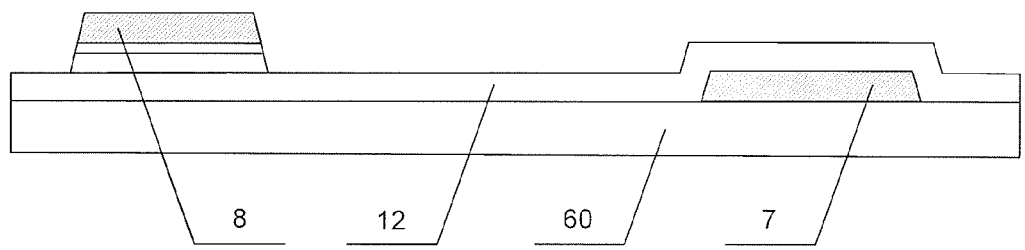
FIG. 11 is a cross-sectional view taken along line B3-B3 in FIG. 9.

On the substrate with the above structure, a gate insulating layer, a semiconductor film and a doped semiconductor film are firstly deposited subsequently by a plasma enhanced chemical vapor deposition (PECVD), and a layer of source/drain metal film is then deposited by a magnetic sputtering or thermal evaporation method. The gate insulating layer may employ an oxide, a nitride or an oxynitride, the source/drain metal film may employ a single layer film, or a composite film comprising layers of metal film. By a patterning process using a half tone or grey tone mask, a data line 2, a power supply line 3, a signal line 4, a first pattern, a second pattern, a third pattern and a second connecting electrode 8 are formed, as shown in FIGS. 9~11.

The first pattern comprises the patterns of a first active layer, a first source electrode 15, a first drain electrode 16 and a first TFT channel region. The first active layer comprising a stack of a semiconductor layer 13 and a doped semiconductor layer 14 is formed on the gate insulating layer 12 and located above the first gate electrode 11. The first source electrode 15 and the first drain electrode 16 are formed above the first active layer with one end of the first source electrode located above the first gate electrode 11 and the other end thereof connected with the data line 2 and one end of first drain electrode 16 located above the first gate electrode and opposite to the first source electrode 15. The first TFT channel region is formed between the first source electrode 15 and the first drain electrode 16 with the doped semiconductor layer being completely etched away and the semiconductor layer being partially etched in the thickness direction in the region so that the semiconductor layer in the first TFT channel region is exposed. Furthermore, the end of the first drain electrode 16 towards the second gate electrode 21 is connected with the second connecting electrode 8.

The second pattern comprises the patterns of a second active layer, a second source electrode 25, a second drain electrode 26 and a second TFT channel region, and the second active layer comprising the stack of the semiconductor layer 13 and the doped semiconductor layer 14 is formed on the gate insulating layer 12 and located above the second gate electrode 21. The second source electrode 25 and the second drain electrode 26 are formed above the second active layer with one end of the second source electrode located above the second gate electrode 21 and the other end thereof connected with the power supply line and one end of the second drain electrode 26 located above the second gate electrode 21 and opposite to the second source electrode 25. The second TFT channel region is formed between the second source electrode 25 and the second drain electrode 26 with the doped semiconductor layer being etched away completely and the semiconductor layer being partially etched in the thickness direction in the region so that the semiconductor layer in the second TFT channel region is exposed. Furthermore, an operation capacitor is formed at the overlapping region between the second drain electrode 26 and the second gate electrode 21.

The third pattern comprises the patterns of a third active layer, a third source electrode 35, a third drain electrode 36 and a third TFT channel region, and the third active layer comprising the stack of the semiconductor layer 13 and the doped semiconductor layer 14 is formed on the gate insulating layer 12 and located above the gate electrode 31. The third source electrode 35 and the third drain electrode 36 are formed above the third active layer with one end of the third active layer 35 is located above the third gate electrode 31 and the other end thereof connected with the signal line 4 and one end of the third drain electrode 36 located above the third gate electrode and the other end thereof connected with the second drain electrode 26. The third TFT channel region is formed between the third source electrode and the third drain electrode 36 with the doped semiconductor layer being etched away completely and the semiconductor layer being partially etched in the thickness direction in the region so that the semiconductor layer in the third TFT channel region is exposed.

The second patterning process in the embodiment of the invention may be a patterning process with multiple step etching, as more specifically described in the following.

Firstly, applying a layer of photoresist on the source/drain metal film and exposing the photoresist with a half tone mask or a grey tone mask, so that the photoresist is formed to have a completely-exposed-region, a non-exposed region and a partially-exposed region. The non-exposed region corresponds to a region in which the data line, the power supply line, the signal line, the first source electrode, the first drain electrode, the second source electrode, the second drain electrode, the third source electrode, the third drain electrode and the second connecting electrode are located. The partially-exposed region corresponds to a region in which the first TFT channel region, the second TFT channel region and the third TFT channel region are located. The completely-exposed region corresponds to a region other than the above regions. After development, the thickness of the photoresist in the non-exposed region is not changed so as to form a photoresist-completely-retained region. The photoresist in the completely-exposed region is etched away so as to form a photoresist-completely-removed region. The photoresist in the partially-exposed region is thinned so as to form a photoresist-partially-remained region.

By a first etching process, the source/drain metal film, the doped semiconductor layer and the semiconductor layer in the completely-exposed region are etched away so as to form the patterns of the first active layer, the second active layer, the third active layer, the data line, the power supply line and the data line.

The photoresist in the partially-exposed region is removed by an ashing process so as to expose the source/drain metal film in this region.

The source/drain metal film and the doped semiconductor in the partially-exposed region is etched away by a second etching process and the semiconductor film in this region is partially etched in the thickness direction so that the semiconductor in this region is exposed and the first source electrode, the first drain electrode, the first TFT channel region, the second source electrode, the second drain electrode, the second TFT channel region, the third source electrode, the third drain electrode, the third TFT channel region and the second connecting electrode. Finally, the remained photoresist is removed so as to complete the second patterning process.

After the patterning process, the gate line 1 and the data line 2 define the pixel region. The power line 3 and the signal line 4 are parallel with the data line 2. The data line 2 is connected with the first source electrode 15, the power supply line 3 is connected with the second source electrode 25, the signal line 4 is connected with the third source electrode 35, the second drain electrode 26 and the third drain electrode 36 are connected with each other into an integral structure, and the first drain electrode 16 and the second connecting electrode 8 are connected with each other into an integral structure. Furthermore, the doped semiconductor film and the semiconductor film are remained under the data line 2, the power supply line 3, the data line 4 and the second connecting electrode 8.

Figure 12:
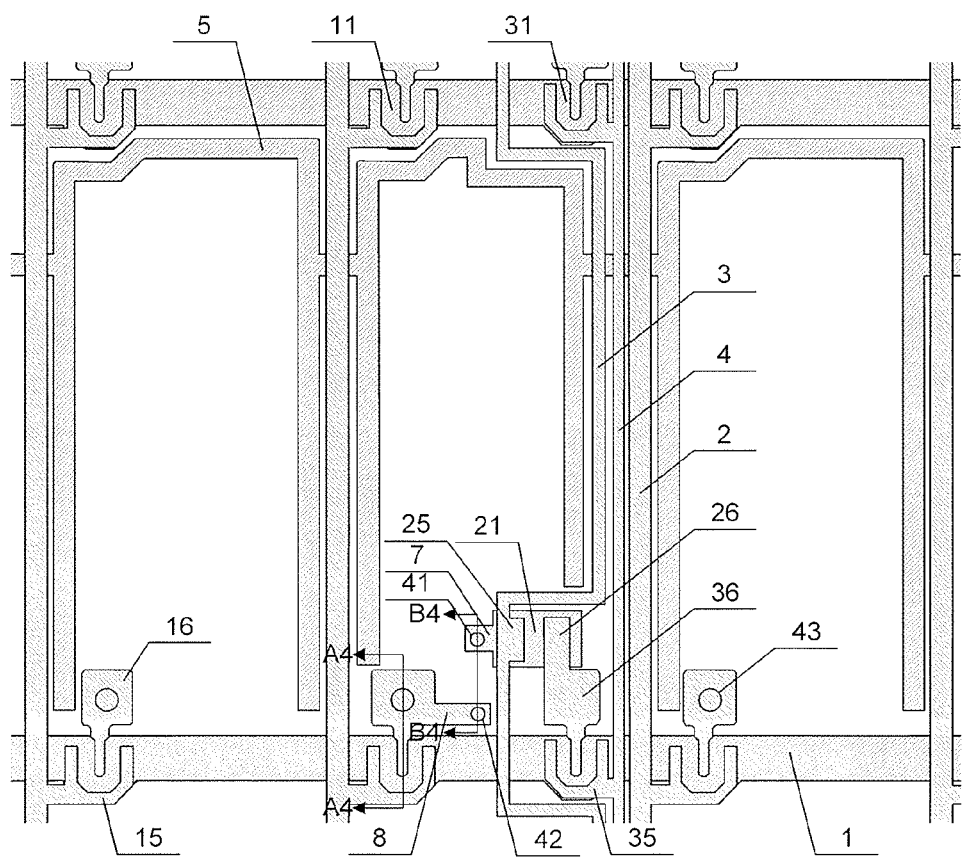
FIG. 12 is a plan view of the TFT-LCD array substrate after a third patterning process according to the embodiment of the invention.
Figure 13:
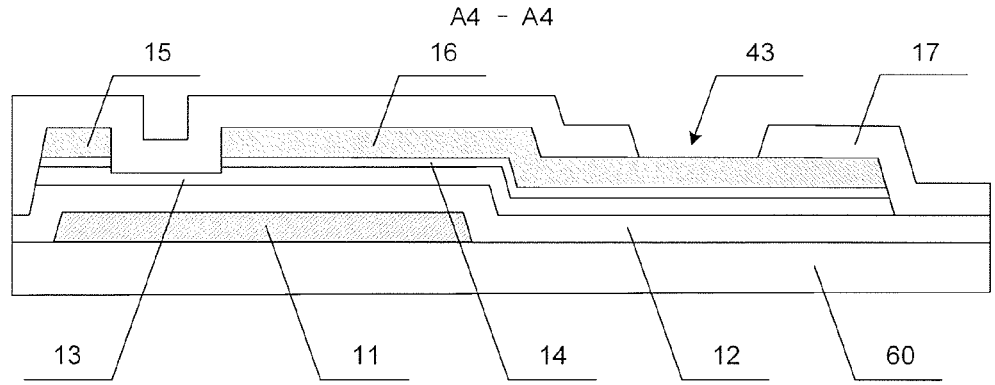
FIG. 13 is a cross-sectional view taken along line A4-A4 in FIG. 12.
Figure 14:
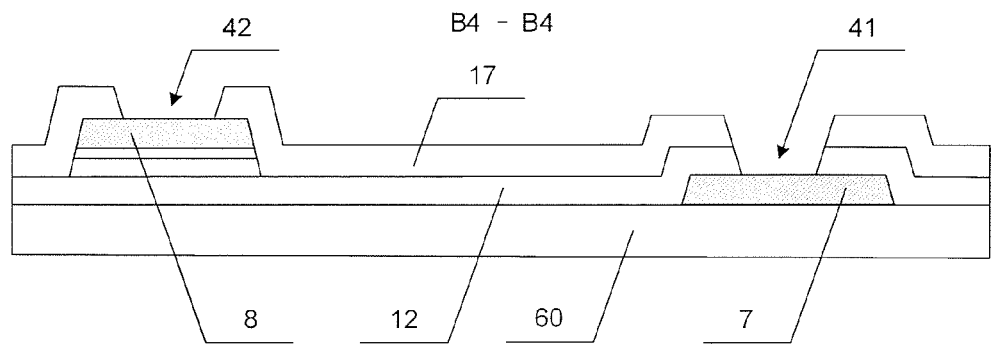
FIG. 14 is a cross-sectional view taken along line B4-B4 in FIG. 12.

FIG. 12 is a plan view showing the TFT-LCD array substrate after a third patterning process according to the embodiment of the invention, showing the structure of three pixel regions, within one of which the pixel structure with a touch element is provided. FIG. 13 is a cross sectional view taken along the line A4-A4 in FIG. 12, and FIG. 14 are the cross sectional view taken along the line B4-B4 in FIG. 12.

On the substrate with the above structures, a passivation layer 17 is deposited by a PECVD method. The passivation layer 17 may employ an oxide, a nitride and an oxynitride. The passivation layer 17 is patterned with a normal mask so as to form a first through hole 41, a second through hole 42 and a third through hole 43. The first through hole 41 is located above the first connecting electrode 7 which is connected with the second gate electrode 21, and the gate insulating layer 12 and the passivation layer 17 in the first through hole are etched away so as to expose the surface of the first connecting electrode 7. The second through hole 42 is located above the second connecting electrode 8 which is connected with the first drain electrode 16, and the passivation layer 17 in the second through hole 42 is etched way so as to expose the surface of the second connecting electrode 8. The third through hole 43 is located above the first drain electrode 16, and the passivation layer 17 in the third through hole 43 is etched away so as to expose the surface of the first drain electrode, as shown in FIGS. 12~14. In the patterning process, patterns of a gate line pad through hole with a gate line pad region and a data line pad through hole with a data line pad region are formed simultaneously. The process used to form the patterns of the gate line pad through hole and the data line pad through hole may be those widely used in the patterning process.

Finally, on the substrate with the above structures, a transparent conductive film, which may be made of materials such as indium tin oxide (ITO), indium zinc oxide (IZO) or aluminum oxide, is deposited by a magnetic sputtering or thermal evaporation method. By a patterning process with a normal mask, a pixel electrode 6 and a third connecting electrode 9 are formed. The pixel electrode 6 is formed in the pixel region and connected with the first drain electrode 16 via the third through hole 43. The third connecting electrode 9 covers the first connecting electrode 7 and the second connecting electrode 8 and connects the first connecting electrode 7 with the second connecting electrode 8 via the first though hole 41 located above the first connecting electrode 7 and the second through hole 42 located above the second connecting electrode 8. That is to say, the first drain electrode 16 are connected with the second gate electrode 21 via the first connecting electrode 7, the first though hole 41, the third connecting electrode 9, the second through hole 42, and the second connecting electrode 8.

The above four-patterning process is only one example to manufacturing the TFT-LCD array substrate according to the embodiment of the invention. The numbers of patterning processes may be increased or reduced, and the different materials or combinations of materials may be selected to realize the embodiment of the invention. For example, the second patterning process for the TFT-LCD array substrate according to the embodiment of the invention may be carried out by two independent patterning processes with normal masks, i.e., forming the first active layer, the second active layer and the third active layer by one patterning process with a normal mask, and forming the data line, the power supply line, the signal line, the first source electrode, the first drain electrode, the first TFT channel region, the second source electrode, the second drain electrode, the second TFT channel region, the third source electrode, the third drain electrode, the third TFT channel region and the second connecting electrode by another patterning process with a normal mask. The process may comprise the following steps.

Firstly, a semiconductor film and a doped semiconductor film are deposited subsequently, and a first active layer, a second active layer and a third active layer are formed by a patterning process with a normal mask. After patterning, each active layer comprises the stacked of the semiconductor layer and the doped semiconductor layer formed on the gate insulating layer. The first active layer is located above the first gate electrode, the second active layer is located above the second gate electrode, and the third active layer is located above the third gate electrode. Thereafter, a layer of source/drain metal film is deposited by a magnetic sputtering or thermal evaporation method, and a data line, a power supply line, a signal line, a first source electrode, a first drain electrode, a first TFT channel region, a second source electrode, a second drain electrode, a second TFT channel region, a third source electrode, a third drain electrode, a third TFT channel region and a second connecting electrode are formed by a patterning process with a normal mask. One end of the first source electrode is located above the first active layer and the other end thereof is connected with the data line. One end of the first drain electrode is located above the first active layer and opposite to the first source electrode. The first TFT channel region is formed between the first source electrode and the first drain electrode with the doped semiconductor being etched away and the semiconductor layer being partially etched in the thickness direction in the region so that the semiconductor layer in the region is exposed. Furthermore, the end of the first drain electrode towards the second gate electrode is connected with the second connecting electrode. One end of the second source electrode is located above the second active layer and the other end thereof is connected with the power supply line. One end of the second drain electrode is located above the second active layer and the other end is provided opposite to the second source electrode. The second TFT channel region is formed between the second source electrode and the second drain electrode with the doped semiconductor layer etched away and the semiconductor layer being partially etched in the thickness direction in the region so that the semiconductor layer in the region is exposed. One end of the third source electrode is located above the third active layer and the other end thereof is connected with the signal line. One end of the third drain electrode is located above the third active layer and the other end thereof is connected with the second drain electrode. The third TFT channel region is formed between the third source electrode and the third drain electrode with the doped semiconductor layer etched away and the semiconductor layer being partially etched in the thickness direction in the region so that the semiconductor layer in the region is exposed. After the patterning process, only the gate insulating layer is remained below the data line, the power supply line, the data line and the second connecting electrode.

The pixel structure with the touch element in the TFT-LCD array substrate according to the embodiment of the invention may be arranged based on pixel point as a unit, in which only one pixel structure with the touch element according to the embodiment of invention is provided for n pixel points (n is a integer in the range from 1 to 100). Each pixel point comprises three sub-pixels, i.e., a red sub-pixel, a blue sub-pixel, and a green sub-pixel. Each sub-pixel corresponds to one pixel region according to the embodiment of the invention. The pixel structure with the touch element according to the embodiment of the invention may be provided in the pixel region corresponding to the blue sub-pixel so as to decrease the influence on the aspect ratio and the display performance as much as possible.

The embodiment of the invention provides a TFT-LCD array substrate applicable to a touch display, in which a power supply line, a signal line, a second TFT and a third TFT are provided in a pixel region so as to form a touch element in a pixel region. The power supply line and the second TFT are used to sense the voltage change of the pixel electrode caused by the change of liquid crystal capacitance during touch and generate a touch voltage reflecting the voltage change of the pixel electrode. The signal line and the third TFT are used to read the touch voltage. The touch display according to the embodiment of the invention do not increase the thickness and the weight of the liquid crystal display, and do not decrease the light transmittance, the brightness and the display performance of the liquid crystal display while omitting the process for bonding the touch display and reducing the produce cost.

The manufacturing method of a TFT-LCD array substrate according to the embodiment of the invention may comprise the following steps.

Step 1, depositing a gate metal film on a substrate, forming a gate line, a common electrode line, a first gate electrode, a second gate electrode, a third gate electrode and a first connecting electrode. The first gate electrode and the third gate electrode are connecting with the gate line, and the second gate electrode is connected with the first connecting electrode.

Step 2, depositing a gate insulating layer, a semiconductor film, a doped semiconductor film and a source/drain metal film on the substrate after step 1, forming a data line, a power supply line, a signal line, a first active layer, a first source electrode, a first drain electrode, a first TFT channel region, a second active layer, a second source electrode, a second drain electrode, a second TFT channel region, a third active layer, a third source electrode, a third drain electrode, a third TFT channel region and a second connecting electrode by a patterning process. The first drain electrode is connected with the second connecting electrode and the second drain electrode is connected with the third drain electrode.

Step 3, depositing a passivation layer on the substrate after step 2, and forming a first through hole, a second through hole and a third though hole. The first through hole is located above the first connecting electrode, the second through hole is located above the second connecting electrode, and the third though hole is located above the first drain electrode.

Step 4, depositing a transparent conductive film on the substrate after step 3, forming a pixel electrode and a third connecting electrode. The pixel electrode is connected with the first drain electrode via the third through hole and the third connecting electrode is connected with the first connecting electrode and the second connecting electrode via the first through hole and the second through hole.

The embodiment of the invention provides a manufacturing method of a TFT-LCD array substrate used in a touch display, which uses a four-patterning process or a five-patterning process. By using the method, the thickness and the weight of the touch display is not increased and the light transmittance, the brightness and the display performance of the liquid crystal display do not decrease while the binding process of the touch display can be omitted and the produce cost can be reduced.

In Step 1, the layer of the gate metal film is first deposited on the substrate by a magnetic sputtering method or a thermal evaporation method, and the gate metal film is patterned with a normal mask, so that the gate line, the first gate electrode, the second electrode, the third gate electrode and the common electrode line are formed. The first gate electrode and the third electrode are connected with the gate line, the second gate electrode is connected with the first connecting electrode, and the common electrode line forms a "Π" shape light blocking structure together with the light blocking bar.

The first example the method of manufacturing a TFT-LCD array substrate according to the embodiment of the invention may comprise the following steps.

Step 11, depositing the gate insulating layer, the semiconductor film and the doped semiconductor film sequentially on the substrate after Step 1 by a plasma enhanced chemical vapor deposition.

Step 12, depositing the source/drain metal by a magnetic sputtering or thermal evaporation method on the substrate after Step 11.

Step 13, applying a layer of photoresist on the source/drain metal film.

Step 14, exposing the photoresist with a half tone or grey tone mask so as to form a photoresist-completely-remained region, a photoresist-completely-removed region and a photoresist-partially-remained region. The photoresist-completely-remained region corresponds to a region in which the data line, the power supply line, the signal line, the first source electrode, the first drain electrode, the second source electrode, the second drain electrode, the third source electrode, the third drain electrode and the second connecting electrode are located, the photoresist-partially-remained region corresponds to a region in which the first TFT channel region, the second TFT channel region and the third TFT channel region are located, and the photoresist-completely-removed region corresponds to a region other than the above regions. After developing, the thickness of the photoresist in the photoresist-completely-remained region remains unchanged, the photoresist in the photoresist-completely-removed region is removed completely, and the thickness of the photoresist in the photoresist-partially-remained region is decreased.

Step 15, etching away the source/drain metal film, the doped semiconductor film and the semiconductor film in the photoresist-completely-removed region by a first etching process so as to form the first active layer, the second active layer, the third active layer, the data line, the power supply line and the signal line.

Step 16, removing the photoresist in the photoresist-partially-remained region by an ashing process so as to expose the source/drain metal film.

Step 17, etching away the source/drain metal film and the doped semiconductor film and partially etching the semiconductor film in the photoresist-partially-remained by a second etching process so as to expose the semiconductor film in this region and form the first source electrode, the first drain electrode, the first TFT channel region, the second source electrode, the second drain electrode, the second TFT channel region, the third source electrode, the third drain electrode, the third TFT channel region and the second connecting electrode.

Step 18, removing the remained photoresist.

The above example is related to a technical solution of forming the first active layer, the second active layer, the third active layer, the data line, the power supply line, the signal line, the first source electrode, the first drain electrode, the first TFT channel region, the second source electrode, the second drain electrode, the second TFT channel region, the third source electrode, the third drain electrode, the third TFT channel region and the second connecting electrode by one patterning process with a half tone or grey tone mask, and the pixel structure after the above steps is shown as FIGS. 9~11.

A second example for manufacturing a TFT-LCD array substrate according to the embodiment of the invention may comprise the following steps.

Step 21, depositing the gate insulating layer, the semiconductor film and the doped semiconductor film sequentially by a plasma enhanced chemical vapor deposition method on the substrate after Step 1.

Step 22, forming the first active layer, the second active layer and the third active layer by a patterning process with a normal mask.

Step 23, depositing the source/drain metal film on the substrate after the above steps by a magnetic sputtering or thermal evaporation method.

Step 24, forming the data line, the power supply line, the signal line, the first source electrode, the first drain electrode, the first TFT channel region, the second source electrode, the second drain electrode, the second TFT channel region, the third source electrode, the third drain electrode, the third TFT channel region and the second connecting electrode by a patterning process with a normal mask.

This example uses two patterning processes employing a normal mask, i.e., forming the first active layer, the second active layer and the third active layer by a patterning process with a normal mask and forming the data line, the power supply line, the signal line, the first source electrode, the first drain electrode, the first TFT channel region, the second source electrode, the second drain electrode, the second TFT channel region, the third source electrode, the third drain electrode, the third TFT channel region and the second connecting electrode by another patterning process by a patterning process with another normal mask.

In Step 3 in the embodiment of the invention, on the substrate with the above formed structure, the passivation layer is deposited by a PECVD method. The passivation layer is patterned with a normal mask so as to form a first through hole, a second through hole and a third through hole. The first through hole is located above the first connecting electrode which is connected with the second gate electrode, and the gate insulating layer and the passivation layer in the first through hole are etched away so as to expose the surface of the first connecting electrode. The second through hole is located above the second connecting electrode which is connected with the first drain electrode, and the passivation layer in the second through hole is etched way so as to expose the surface of the second connecting electrode. The third through hole is located above the first drain electrode, and the passivation layer in the third through hole is etched away so as to expose the surface of the first drain electrode. In the patterning process, the gate line pad through hole and the data line pad through hole can be formed also.

In Step 4, the transparent conductive film is deposited by a magnetic sputtering or thermal evaporation method and the pixel electrode and the third connecting electrode are formed by a pattering process with a normal mask. The pixel electrode is formed in the pixel region and connected with the first drain electrode via the third through hole. The third connecting electrode covers the first and second connecting electrodes, and the third connecting electrode connects the first connecting electrode and the second connecting electrode via the first through hole located above the first connecting electrode and the second through hole located above the second connecting electrode, i.e., the first drain electrode and the second gate electrode are connected with each other via the first connecting electrode, the first trough hole, the third connecting electrode, the second through hole and the second connecting electrode.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A touch display comprising:
   a first substrate formed with a common electrode;
   a second substrate formed with a gate line and a data line, wherein a first thin film transistor and a pixel electrode is provided in a pixel region defined by the gate line and the data line, the pixel electrode is connected with the first thin film transistor, and the pixel electrode and the common electrode form a liquid crystal capacitor;
   a touch element provided in the pixel region in the second substrate, connected to the pixel electrode, and used to sense a touch voltage reflecting the change of liquid crystal capacitance of the liquid crystal capacitor formed by the pixel electrode and the common electrode at a touch point; and
   a touch processing device connected with the touch element and used to obtaining a position coordinates of the touch point according to a touch voltage, wherein,
   the first thin film transistor comprises a first gate electrode, a first source electrode and a first drain electrode,
   the first gate electrode is formed on the second substrate; a gate insulating layer is formed on the first gate electrode; a first active layer, comprising a stack of a semiconductor layer and a doped semiconductor layer, is formed on the gate insulating layer; the first source electrode is formed on the first active layer with one end of the first source electrode being located above the first gate electrode and another end thereof being connected with the data line; the first drain electrode is formed on the first active layer with one end of the first drain electrode being located above the first gate electrode and another thereof being connected with the first drain electrode of the first thin film transistor; a first TFT channel region is formed between the first source electrode and the first drain electrode with the doped semiconductor layer being completely removed and the semiconductor layer being partially etched in a thickness direction in the first TFT channel region so that the semiconductor layer in the first TFT channel region is exposed; a passivation layer is formed on the data line, the first source electrode, the first drain electrode and the first TFT channel region; and a third through hole, by which the first drain electrode and the pixel electrode are connected, is provided in the passivation layer.

2. The touch display of claim 1, wherein, the touch element comprises:
   a power supply line parallel with the data line and used to provide an operation voltage;
   a signal line parallel with the data line and used to send the touch voltage to the touch processing device;
   a second thin film transistor connected with the power supply line and the pixel electrode, respectively and used to sense voltage change of the pixel electrode caused by liquid crystal capacitance change at the touch point and generate the touch voltage reflecting the voltage change of the pixel electrode; and
   a third thin film transistor connected with the signal line and the second thin film transistor and used to send the touch voltage to the signal line.

3. The touch display of claim 2, wherein,
   the second thin film transistor comprises a second gate electrode, a second source electrode and a second drain electrode, wherein the second gate electrode is connected with the pixel electrode so that the ON state degree of the second thin film transistor is changed by the voltage change of the pixel electrode, the second source electrode is connected with the power supply line, and an operation capacitor is provided between the second drain electrode and the second gate electrode so that an operating voltage provided from the power supply line is stored in the operation capacitor and the touch voltage that is changed with the ON state degree of the second thin film transistor is generated; and
   the third thin film transistor comprises a third gate electrode, a third source electrode and a third drain electrode, wherein the third source electrode is connected with the gate line, the third source electrode is connected with the signal line, and the third drain electrode is connected with the second drain electrode so that the touch voltage is sent to the signal line.

4. The touch display of claim 2, wherein, the touch processing device comprises:
   an acquisition module being connected with the signal line and used to collect the touch voltage from the signal line,
   a judgment module being connected with the acquisition module and used to compare the touch voltage and a reference voltage which is predetermined and generate a touch signal in the case where the difference between the touch voltage and the reference voltage is larger than a predetermined threshold voltage, and
   a processing module being connected with the judgment modules and used to determine the position coordinates of the touch point according to column number of the signal line and the row number of the gate line corresponding to the touch signal.

5. The touch display of claim 1, wherein, the touch processing device comprises:
   an acquisition module connected with the signal line and used to collect the touch voltage from the signal line,
   a judgment module connected with the acquisition module and used to compare the touch voltage with a reference voltage which is predetermined and generate a touch signal in the case where the difference between the touch voltage and the reference voltage is larger than a predetermined threshold voltage, and
   a processing module connected with the judgment modules and used to determine the position coordinates of the touch point according to a column number of the signal line and a row number of the gate line corresponding to the touch signal.

6. A thin film transistor liquid crystal display (TFT-LCD) array substrate comprising a gate line, a data line and a power supply line and a signal line formed on a substrate,
   wherein, the gate line and the data line define a pixel region, and a pixel electrode, a first thin film transistor, a second thin film transistor and a third thin film transistor are formed in the pixel region, and
   wherein, the first thin film transistor is connected with the data line and the pixel electrode and used to provide a data voltage to the pixel electrode, the second thin film transistor is connected with the power supply line and the pixel electrode and used to generate a touch voltage reflecting the change of liquid crystal capacitance provided with the pixel electrode at a touch point, and the third thin film transistor is connected with the signal line and the second thin film transistor and used to send the touch voltage to the signal line,
   wherein,
   the first thin film transistor comprises a first gate electrode, a first source electrode and a first drain electrode,
   the first gate electrode is formed on the substrate; a gate insulating layer is formed on the first gate electrode; a first active layer, comprising a stack of a semiconductor layer and a doped semiconductor layer, is formed on the gate insulating layer; the first source electrode is formed on the first active layer with one end of the first source electrode being located above the first gate electrode and another end thereof being connected with the data line; the first drain electrode is formed on the first active layer with one end of the first drain electrode being located above the first gate electrode and the other thereof being connected with the first drain electrode of the first thin film transistor; a first TFT channel region is formed between the first source electrode and the first drain electrode with the doped semiconductor layer being completely removed and the semiconductor layer being partially etched in a thickness direction in the first TFT channel region so that the semiconductor layer in the first TFT channel region is exposed; a passivation layer is formed on the data line, the first source electrode, the first drain electrode and the first TFT channel region; and a third through hole, by which the first drain electrode and the pixel electrode are connected, is provided in the passivation layer.

7. The TFT-LCD array substrate of claim 6, wherein, the first thin film transistor comprises a first gate electrode, a first source electrode and a first drain electrode, and the first gate electrode is connected with the gate line, the first source electrode is connected with the data line, and the first drain electrode is connected with the pixel electrode, so that the data voltage over the data line is capable of being provided to the pixel electrode though the first thin film transistor.

8. The TFT-LCD array substrate of claim 6, wherein, the second thin film transistor comprises a second gate electrode, a second source electrode and a second drain electrode, the second gate electrode is connected with the pixel electrode so that the ON state degree of the second thin film transistor is capable of being changed by voltage change of the pixel electrode caused by liquid crystal capacitance change at the touch point, the second source electrode is connected with the power supply line, and an operation capacitor is provided between the second drain electrode and the second gate electrode so that an operating voltage provided from the power supply line is stored in the operation capacitor and the touch voltage that is changed with the ON state degree of the second thin film transistor is generated.

9. The TFT-LCD array substrate of claim 8, wherein, the second gate electrode is formed on the substrate and connected with the first drain electrode of the first thin film transistor; the gate insulating layer is formed on the second gate electrode; the second active layer, comprising the stack of the semiconductor layer and the doped semiconductor layer, is formed on the gate insulating layer; the second source electrode is formed on the second active layer with one end of the second source electrode being located above the second gate electrode and the other end thereof being connected with the power supply line; the second drain electrode are formed on the second active layer with one end of the drain electrode being located above the second gate electrode and opposite to the second source electrode; the second TFT channel region is formed between the second source electrode and the second drain electrode with the doped semiconductor being completely etched away and the semiconductor layer being partially etched in the thickness direction in the second TFT channel region so that the second semiconductor layer in the TFT channel region is exposed; and the passivation layer is formed on the power supply line, the second source electrode, the second drain electrode and the second TFT channel region.

10. The TFT-LCD array substrate of claim 6, wherein, the third thin film transistor comprises a third gate electrode, a third source electrode and a third drain electrode, the third source electrode is connected with the gate line, the third source electrode is connected with the signal line, and the third drain electrode is connected with the second drain electrode and sends the touch voltage to the signal line.

11. The TFT-LCD array substrate of claim 10, wherein, the third gate electrode is formed on the substrate and connected with the gate line; the gate insulating layer is formed on the third gate electrode; the third active layer, comprising the stack of the semiconductor layer and the doped semiconductor layer, is formed on the gate insulating layer; the third source electrode is formed on the third active layer with one end of the third source electrode being located above the third gate electrode and the other thereof connected with the signal line; the third drain electrode is formed on the third active layer with one end of the third drain electrode being located above the third gate electrode and the other end thereof connected with the second drain electrode of the second thin film transistor; the third TFT channel region is formed between the third source electrode and the third drain electrode with the doped semiconductor layer being completely etched away and the semiconductor layer being partially etched in the thickness direction in the region so that the semiconductor layer in the region is exposed; and the passivation layer is formed on the signal line, the third source electrode, the third electrode and the third TFT channel region.

12. The TFT-LCD array substrate of claim 6, wherein, the first drain electrode of the first thin film transistor is connected with the second gate electrode of the second thin film transistor via the first connecting electrode, the second connecting electrode and the third connecting electrode.

13. The TFT-LCD array substrate of claim 12, wherein, the first connecting electrode and the second gate electrode are provided in the same layer and connected with each other, and a first through hole is formed through the gate insulating layer and the passivation layer above the first connecting electrode; the second connecting electrode and the first drain electrode are provided in the same layer and connected with each other, and a second through hole is formed through the passivation layer above the second connecting electrode; and the third connecting electrode is connected with the first connecting electrode and the second connecting electrode via the first through hole and the second through hole.

* * * * *